United States Patent
Beck et al.

(10) Patent No.: US 12,096,577 B1
(45) Date of Patent: Sep. 17, 2024

(54) POWER SEMICONDUCTOR ARRANGEMENT HAVING A COVER FACILITY AND METHOD FOR RELEASING IT

(71) Applicant: SEMIKRON DANFOSS ELEKTRONIK GMBH & CO. KG, Nuremberg (DE)

(72) Inventors: Markus Beck, Neumarkt (DE); Sandro Bulovic, Langenzenn (DE); Thomas Götze, Höchstadt (DE); Alexander Wehner, Nuremberg (DE); Markus Müller, Nuremberg (DE); Peter Lemke, Schwabach (DE); Roland Bittner, Stegaurach (DE); Christian Zeiler, Pommersfelden (DE); Johannes Klier, Amberg (DE); Bernd Fischer, Eckental (DE)

(73) Assignee: SEMIKRON DANFOSS ELEKTRONIK GMBH & CO. KG, Nuremberg (DE)

( * ) Notice: Subject to any disclaimer, the term of this patent is extended or adjusted under 35 U.S.C. 154(b) by 0 days.

(21) Appl. No.: 18/657,680

(22) Filed: May 7, 2024

(30) Foreign Application Priority Data

May 17, 2023 (DE) ...................... 10 2023 113 072.2

(51) Int. Cl.
*H05K 5/02* (2006.01)
*H05K 5/00* (2006.01)

(52) U.S. Cl.
CPC ......... *H05K 5/0295* (2013.01); *H05K 5/0008* (2013.01); *H05K 5/0221* (2013.01)

(58) Field of Classification Search
CPC ..................................................... H05K 5/00
See application file for complete search history.

(56) References Cited

U.S. PATENT DOCUMENTS

| | | | | |
|---|---|---|---|---|
| 5,701,232 A | * | 12/1997 | Tang ..................... | G06F 1/1613 |
| | | | | 174/67 |
| 2014/0106591 A1 | * | 4/2014 | Menez ................. | H01R 13/641 |
| | | | | 439/304 |

FOREIGN PATENT DOCUMENTS

| | | |
|---|---|---|
| DE | 102008022982 A1 | 12/2008 |
| JP | 2020-184875 A | 11/2020 |

OTHER PUBLICATIONS

DE 10 2023 113 072.2, Decision to Grant dated Jan. 29, 2004—3 pages—German with partial English translation.

(Continued)

*Primary Examiner* — Jerry Wu
(74) *Attorney, Agent, or Firm* — Andrew F. Young; Nolte Lackenbach Siegel

(57) ABSTRACT

A power semiconductor arrangement has a switching facility, a housing, having a load connection facility for connecting in an electrically conductive manner to an external supply line and having a first plug-in connecting facility for plug-in connecting to an external second plug-in connecting facility. The housing has a first opening through which a connecting facility for connecting the load connection facility and the associated external supply line is accessible. A cover facility for covering the first opening is on the housing so as to be mechanically movable from a first end position into a second end position and has a first locking facility which cooperates with the external second plug-in connecting facility, whereby the first opening is closed with the cover facility as long as it is in its first end position, as long as the external second plug-in connecting facility is inserted into the first plug-in connecting facility.

7 Claims, 5 Drawing Sheets

(56) References Cited

OTHER PUBLICATIONS

DE 10 2023 113 072.2, Search report dated Jan. 18, 2024, 7 pages—German, 8 pages—English.

* cited by examiner

POWER SEMICONDUCTOR ARRANGEMENT HAVING A COVER FACILITY AND METHOD FOR RELEASING IT

CROSS REFERENCE TO RELATED APPLICATIONS

This application relates to and claims priority to DE 10 2023 113 072.2 filed May 17, 2023, the entire contents of which are incorporated herein fully by reference.

FIGURE SELECTED FOR PUBLICATION

FIG. 1.

BACKGROUND OF THE INVENTION

Field of the Invention

The invention relates to a power semiconductor arrangement having a switching facility, having a housing, having a load connection facility for connecting in an electrically conductive manner to an external supply line and having a first plug-in connecting facility for plug-in connecting to an external second plug-in connecting facility, wherein the housing has a first opening through which a connecting facility for connecting the load connection facility and the associated external supply line is accessible.

Description of the Related Art

The prior art discloses by way of example in DE 10 2008 022 982 A1 a locking connection for use in conjunction with an electrical high voltage system. The locking connection comprises a male section, an elastic element and a female section which is suitable for receiving the male section therein. The female section comprises an access hole through which the elastic element is accessible when the male section is received in the female section. The elastic element is coupled to the male section and configured so as to engage with the female section in order to prevent separation of the male section from the female section until the elastic element is deformed.

ASPECTS AND OBJECTS OF THE INVENTION

At least one of the objects of the present invention is to provide an improvement over the related art.

One object of the invention is to provide a universal, mechanical possibility for covering a load connection facility of a power semiconductor arrangement and a method for the release.

The objects and aspects are achieved in accordance with the invention by a power semiconductor arrangement having a switching facility, having a housing, having a load connection facility for connecting in an electrically conductive manner to an external supply line and having a first plug-in connecting facility for plug-in connecting to an external second plug-in connecting facility, wherein the housing has a first opening through which a connecting facility for connecting the load connection facility and the associated external supply line is accessible, wherein a cover facility for covering the first opening is arranged on the housing in such a manner as to be mechanically movable from a first end position into a second end position and has a first locking facility which cooperates functionally with the external second plug-in connecting facility, whereby the first opening is closed with the cover facility as long as it is in its first end position, as long as the external second plug-in connecting facility is inserted into the first plug-in connecting facility.

It is naturally advantageous if one of the plug-in connecting facilities is designed as a socket and the other as a plug.

It can be preferable if a plug housing of the external, second plug-in connecting facility cooperates with the first locking facility.

It can be particularly preferable if the cover facility is arranged so that it can be moved relative to the housing or if the cover facility is arranged in a rotatable manner on the housing.

It is particularly advantageous if the first locking facility in its second end position prevents the external second plug-in connecting facility being inserted into the first plug-in connecting facility. In this case, it is simultaneously advantageous if the first plug-in connecting facility, which is provided in particular for servicing purposes, still remains accessible.

It can also be advantageous if the cover facility has a second locking facility, in particular influences if it influences the logical or temporal sequence of the release of the opening. In this case, it can be particularly advantageous if the second locking facility cooperates functionally with the external second plug-in connecting facility, in particular with its plug housing, whereby the second locking facility cannot be released as long as the external second plug-in connecting facility is inserted into the first plug-in connecting facility. It can also be advantageous if the second locking facility cooperates with the housing, whereby the cover facility cannot be moved as long as the second locking facility is connected in a non-positive or positive-locking manner to the housing. Furthermore, it can be advantageous if the second locking facility is designed as a screw which engages through the cover facility into the housing.

The object is furthermore achieved by a method for the release of a first opening of a housing of an above mentioned power semiconductor arrangement, whereby starting from the arrangement of the external, second plug-in connecting facility in the first plug-in connecting facility, it is first necessary to cancel this arrangement in order to move the cover facility and thus release the first opening.

In so doing, it can be advantageous if the cover facility has a second locking facility 44 which can only be released if the arrangement of the external second plug-in connecting facility in the first plug-in connecting facility is cancelled and only after the subsequent release of the second locking facility can the cover facility be moved and thus the first opening can be released.

Of course, unless this is explicitly or per se excluded or contradicts the idea of the invention, the features or groups of features mentioned in each case in the singular, in particular the external supply line, can be present more than once in the power semiconductor arrangement in accordance with the invention.

It goes without saying that the different embodiments of the invention, regardless of whether they are disclosed in conjunction with the power semiconductor arrangement or method, can be realised individually or in any combinations in order to achieve the improvements. In particular, the features mentioned and explained above and below are not only usable in the stated combinations but can also be used in other combinations or a stand-alone without departing the scope of the present invention.

Further explanations of the invention, advantageous details and features are disclosed in the description below of the exemplary embodiments of the invention that are illustrated schematically in the figures or of respective parts thereof.

The above and other aspects, features, objects, and advantages of the present invention will become apparent from the following description read in conjunction with the accompanying drawings for exemplary but nonlimiting embodiments, in which like reference numerals designate the same elements.

DETAILED DESCRIPTION OF THE PREFERRED EMBODIMENTS

Figure 1:
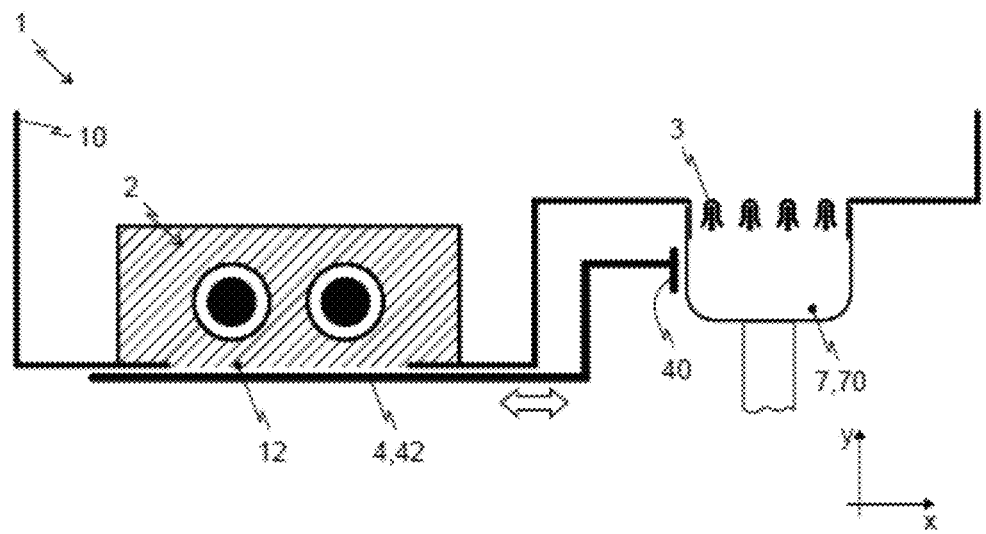
FIGS. 1 to 4 show schematically a first embodiment of a power semiconductor arrangement in accordance with the invention in different views and different steps of the method in accordance with the invention.
Figure 2:
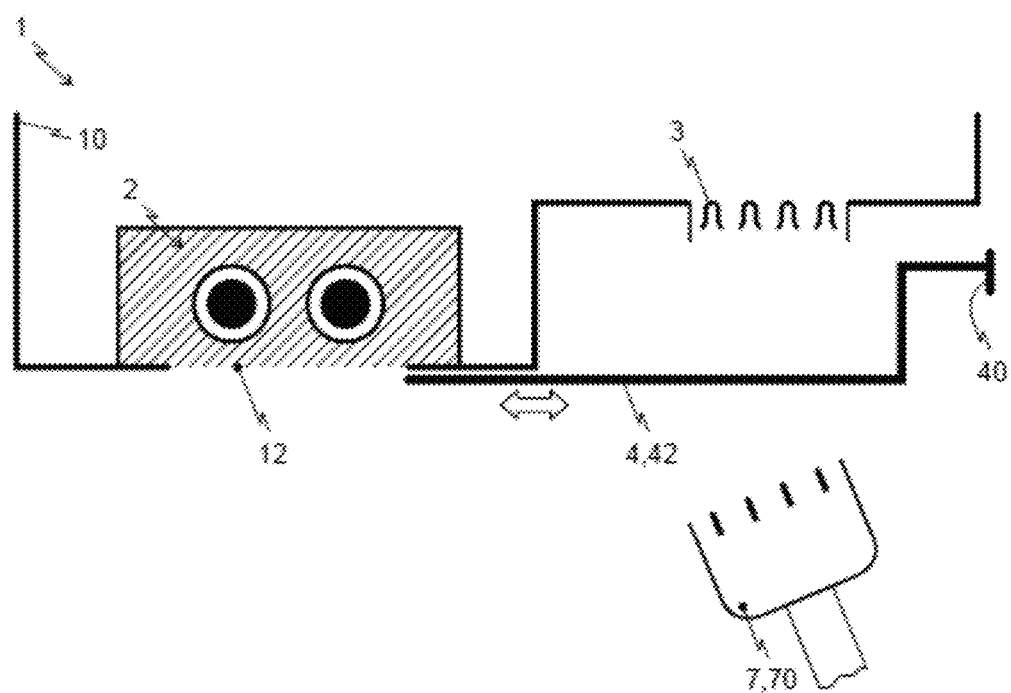

Reference will now be made in detail to embodiments of the invention. Wherever possible, same or similar reference numerals are used in the drawings and the description to refer to the same or like parts or steps. The drawings are in simplified form and are not to precise scale. The word 'couple' or 'bond' or and similar terms do not necessarily denote direct and immediate connections, but also include connections through intermediate elements or devices. For purposes of convenience and clarity only, directional (up/down etc.) or motional (forward/back, etc.) terms may be used with respect to the drawings. These and similar directional terms should not be construed to limit the scope in any manner. It will also be understood that other embodiments may be utilized without departing from the scope of the present invention, and that the detailed description is not to be taken in a limiting sense, and that elements may be differently positioned, or otherwise noted as in the appended claims without requirements of the written description being required thereto.

FIGS. 1 to 4 show schematically a first embodiment of a power semiconductor arrangement 1 in accordance with the invention in different views and different steps of the method in accordance with the invention. The power semiconductor arrangement 1 has in this case a housing 10 that is only partially illustrated. A power electronic switching facility, not illustrated, is arranged in the housing 10 and is designed so as to be supplied from a voltage source, preferably a DC voltage source such as a battery or a capacitor arrangement or a combination of both. This switching facility converts the DC voltage that is applied to it into an AC voltage with which a connected electric motor, preferably a drive motor of a vehicle, is operated.

Furthermore, the housing 10 has a first plug-in connecting facility 3, which is connected internally to an actuating facility of the switching facility in order to actuate it and thus actuate the connected motor as required. By means of this first plug-in connecting facility 3, a low voltage connection is produced to a superordinate, external controller. For this purpose, the external controller has a supply line which can be connected by means of an external second plug-in connecting facility 7 to the first plug-in connecting facility. In this embodiment, the first plug-in connecting facility 3 is designed as a socket having a plurality of contact receptacles, whereas the external second plug-in connecting facility 7 is designed as a plug having a plug housing and contact pins.

Furthermore, the power semiconductor arrangement 1 has a load connection facility 2 for connecting the switching facility in an electrically conductive manner to an external supply line 5, in this case by way of example a DC voltage supply line which is connected to a battery. In order to connect the external supply lines, they are inserted in the z-direction into the housing 10. Furthermore, the housing 10 has a first opening 12, through which a load connection facility 2 is accessible, by means of which the external supply lines 5 can be connected by a clamping facility 22 of the connecting facility 20 to the switching facility in the interior of the housing 10, the clamping facility 22 being designed as a screw connection.

Figure 3:
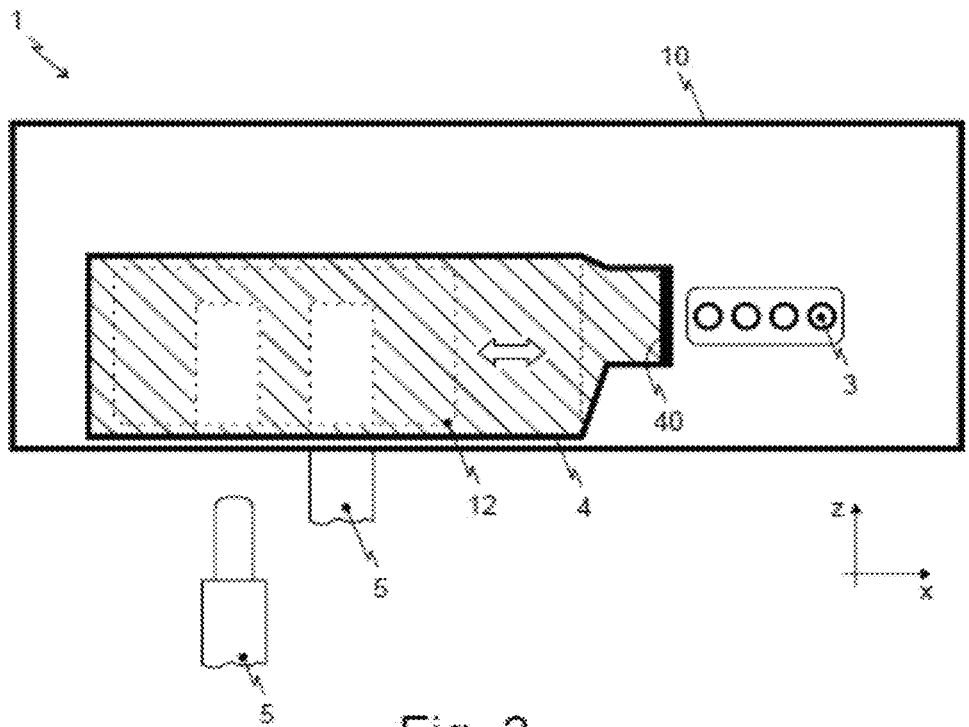
Figure 4:
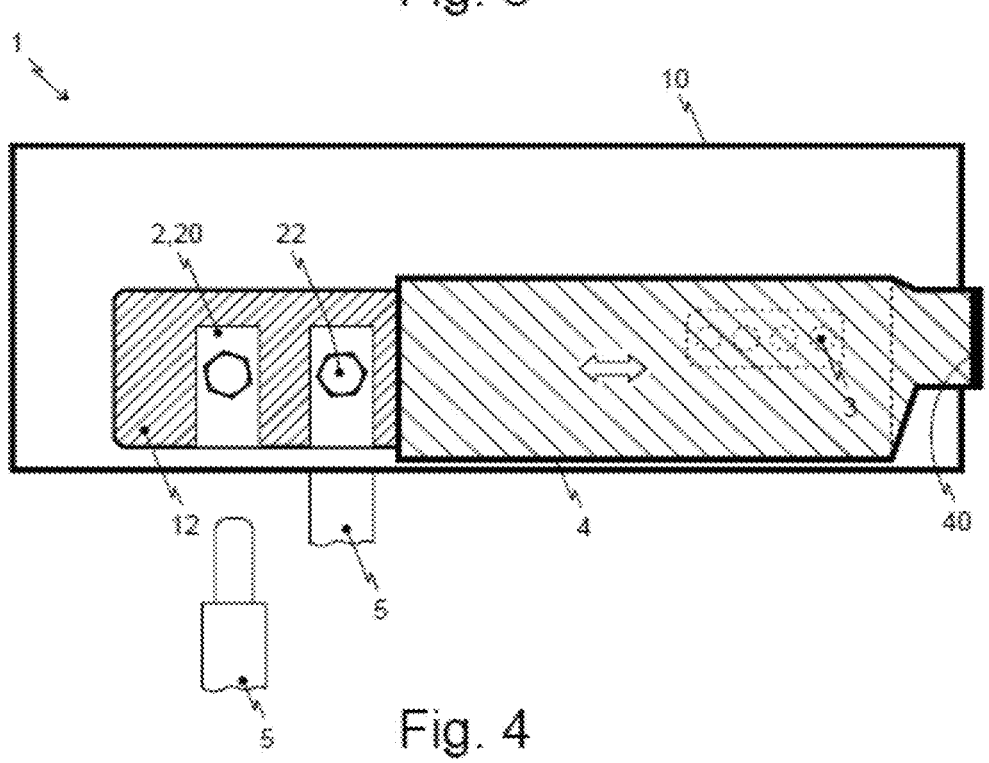

The first opening 12 is closed by means of a cover facility 4, to be more precise a section 42 of the cover facility 4, which is then located in a first end position, cf. FIGS. 1 and 3, so that access to the load connection facility 2 is not possible. The cover facility 4 is arranged in a mechanically displaceable manner along the front face of the housing 10 on which the opening 12 is located. The cover facility 4 extends in this case in the x-z plane and is displaceable in the x-direction up to a second end position, cf. FIGS. 2 and 4.

Furthermore, the cover facility 4 has a first locking facility 40 which cooperates functionally with the external second plug-in connecting facility 7. As long as the external second plug-in connecting facility 7 is inserted into the first plug-in connecting facility 3, the first locking facility 40 prevents it from being pushed out of the first end position, whereby the opening 12 is released and thus would be accessible. The first locking facility 40 is designed in this case as a contact surface which is arranged in the first end position of the first locking facility 40 close to the external second plug-in connecting facility 7, to be more precise its plug housing 70.

After the external second plug-in connecting facility 7 has been removed, the cover facility 4 is no longer prevented from moving in the x-direction by the plug housing 70. The cover facility 4 can be pushed into its second end position, whereby the opening 12 is released and the load connection facility 2 is accessible. By way of example, the connection to the external supply lines 5 can now be released and they can be removed.

Figure 5:
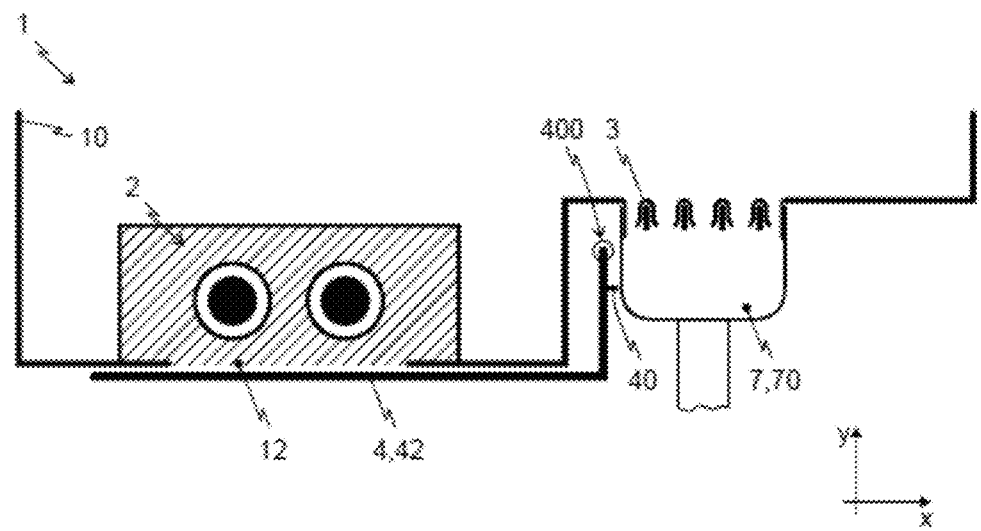
FIGS. 5 to 6 show schematically a second embodiment of a power semiconductor arrangement in accordance with the invention in different views and different steps of the method in accordance with the invention.
Figure 6:
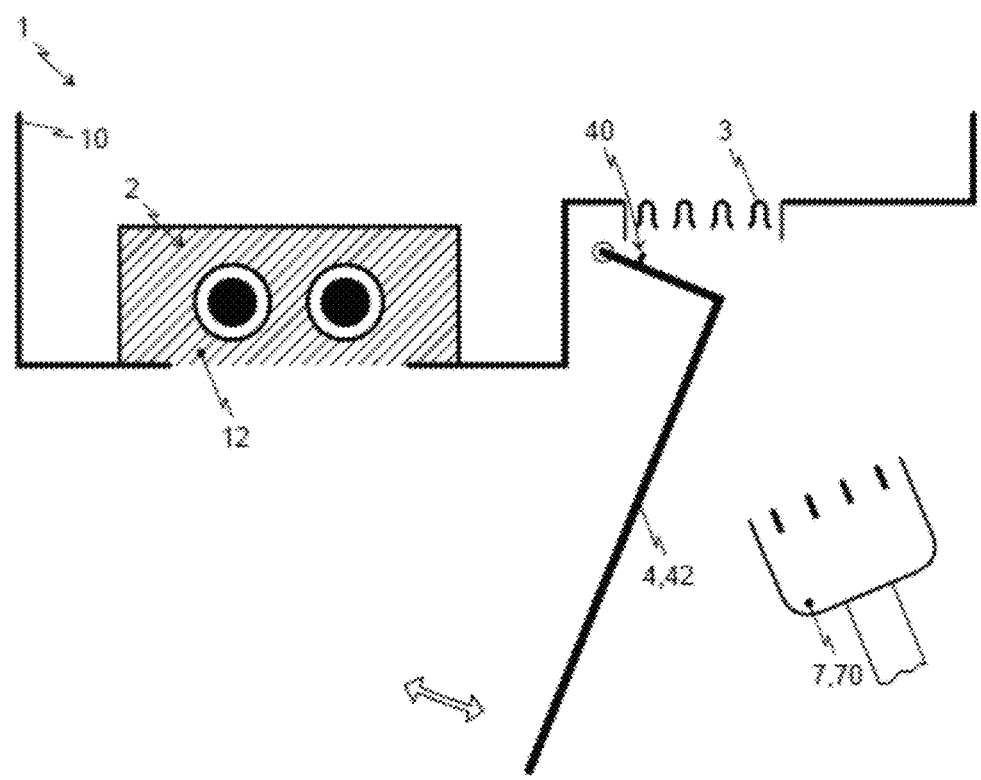

FIGS. 5 to 6 show schematically a second embodiment of a power semiconductor arrangement 1 in accordance with the invention in different views and different steps of the method in accordance with the invention.

This second embodiment differs from the first exclusively by the design and arrangement of the cover facility 4. In this case, this cover facility 4 is arranged in a rotatable manner on the housing 10 and has an axis of rotation 400 in the z-direction. The first locking facility 40 is designed in this case as an extension of the cover facility 4 in the proximity of the axis of rotation 400, wherein this first locking facility 40 cooperates with the external second plug-in connecting facility 7 and only allows the cover facility 4 is only allowed to rotate if the external second plug-in connecting facility 7 has been completely removed from the first plug-in connecting facility 3. The cover facility 4 can then be rotated from its first end position, cf. FIG. 5, into a second end position, whereby the opening 12 is accessible. In FIG. 6, the second end position has not yet been fully reached.

Figure 7:
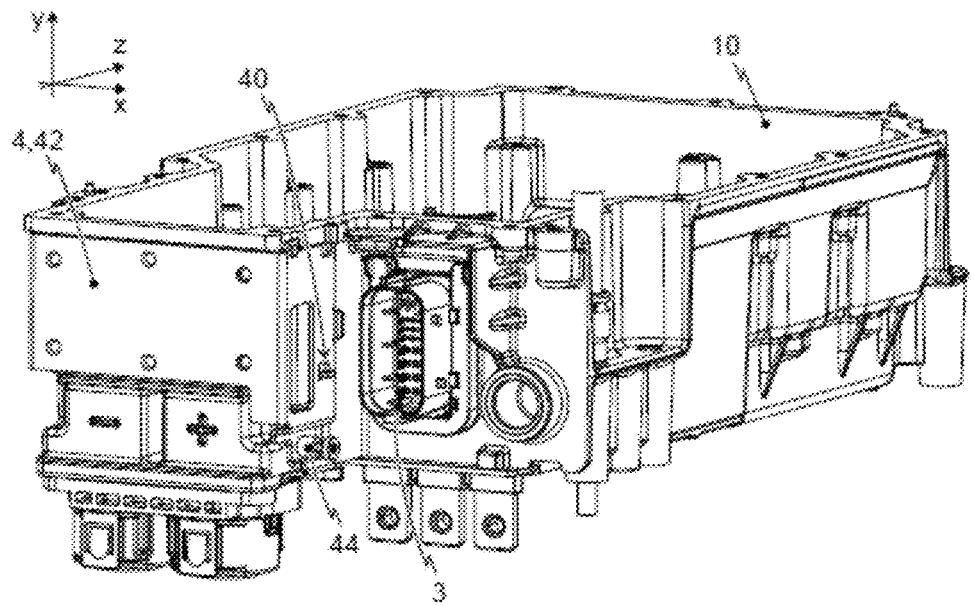
FIGS. 7 to 9 show constructively three-dimensional views of a second very similar embodiment of the power semiconductor arrangement in accordance with the invention in different views and different steps of the method in accordance with the invention.
Figure 8:
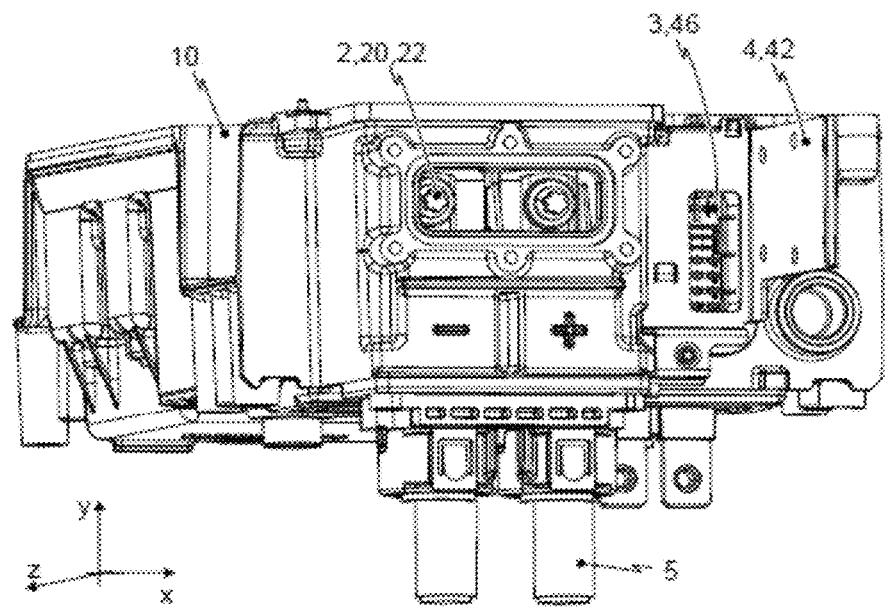
Figure 9:
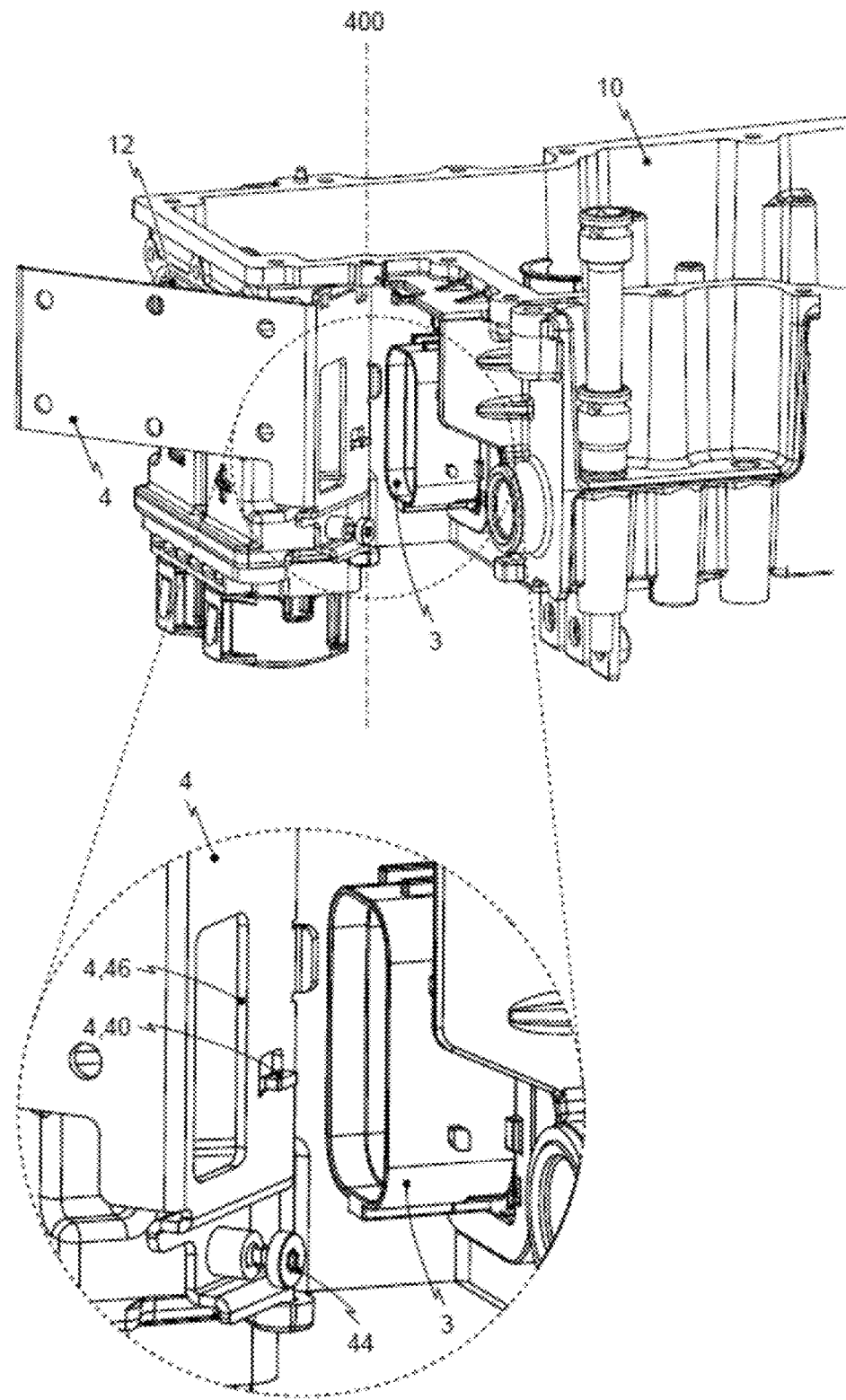

FIGS. 7 to 9 show constructive, three-dimensional views of a second, very similar embodiment of the power semiconductor arrangement 1 in accordance with the invention in different views and different steps of the method in accordance with the invention. The movement of the cover facility 4 from the first into a second end position corresponds in this case in turn to a rotational movement about an axis 400 in the z-direction.

A first significant difference to the second embodiment in accordance with FIGS. 5 and 6 is in this case the presence of a second locking facility 44. This is configured in this case as a securing screw which engages through the cover facility 4 into the housing 10 and is thus connected in a non-positive locking manner. The cover facility 4 can therefore only be moved out of its first end position, cf. FIG. 7, in order to release the opening 12, as soon as the second locking facility 44 has been released. In addition, the second locking facility 44 cooperates functionally with the external second plug-in connecting facility 7, to be more precise with its plug housing 70. The second locking facility 44 cannot be released as long as the external second plug-in connecting facility 7 is inserted in the first plug-in connecting facility 3.

This results in a two-stage release procedure for the opening 12 of the housing 10: first the external second plug-in connecting facility 7 must be removed from the first plug-in connecting facility 3, then the second locking device 44 must be released and only then can the cover facility 4 be moved out of its first end position in order to release the opening 12 and make it accessible.

A second significant difference to the second embodiment according to FIGS. 5 and 6 is in this case the presence of a recess 46 in the cover facility 4, which, when the cover facility 4 is arranged in its second end position, allows access to the first plug-in connecting facility 3 without in so doing the external second plug-in connecting facility 7 being able to be plugged into the first one. This therefore allows service operation of the power semiconductor arrangement 1 with the possibility of access to the opening 12 and thus to the load connection facility 2. However, a normal operation, in which the external second plug-in connecting facility 7 must be arranged in the first plug-in connecting facility 3 is thus excluded.

Also, the inventors intend that only those claims which use the specific and exact phrase "means for" are intended to be interpreted under 35 USC 112. The structure, device, and arrangement herein is noted and well supported in the entire disclosure. Moreover, no limitations from the specification are intended to be read into any claims, unless those limitations are expressly included in the claims.

Having described at least one of the preferred embodiments of the present invention with reference to the accompanying drawings, it will be apparent to those skills that the invention is not limited to those precise embodiments, and that various modifications and variations can be made in the presently disclosed system without departing from the scope or spirit of the invention. Thus, it is intended that the present disclosure covers modifications and variations of this disclosure provided they come within the scope of the appended claims and their equivalents.

What is claimed is:

1. A power semiconductor arrangement, having a switching facility, comprising:
   a housing having a load connection facility for connecting in an electrically conductive manner to an external supply line and having a first plug-in connecting facility for plug-in connecting to an external second plug-in connecting facility;
   the housing has a first opening through which a connecting facility for connecting the load connection facility and the associated external supply line is accessible;
   a cover facility for covering the first opening is arranged on the housing in such a manner as to be mechanically movable from a first end position into a second end position and has a first locking facility which cooperates functionally with the external second plug-in connecting facility;
   whereby the first opening is closed with the cover facility as long as it is in its first end position, as long as the external second plug-in connecting facility is inserted into the first plug-in connecting facility; and
   the cover facility is arranged so that it can be moved relative to the housing or the cover facility is arranged in a rotatable manner on the housing;
   the cover facility has a second locking facility;
   the second locking facility cooperates functionally with the external second plug-in connecting facility, in particular with its plug housing, whereby the second locking facility cannot be released as long as the external second plug-in connecting facility is inserted into the first plug-in connecting facility; and
   the second locking facility cooperates with the housing, whereby the cover facility cannot be moved as long as the second locking facility is connected in a non-positive or positive-locking manner to the housing.

2. The power semiconductor arrangement, according to claim 1, wherein:
   one of the plug-in connecting facilities is designed as a socket and the other as a plug.

3. The power semiconductor arrangement, as claimed in claim 2, wherein:
   a plug housing of the external second plug-in connecting facility cooperates with the first locking facility.

4. The power semiconductor arrangement, as claimed in claim 2, wherein:
   the first locking facility in its second end position prevents the external second plug-in connecting facility being inserted into the first plug-in connecting facility.

5. The power semiconductor arrangement, as claimed in claim 4, wherein:
   the first plug-in connecting facility still remains accessible for an external third plug-in connecting facility.

6. The power semiconductor arrangement, as claimed in claim 1, wherein:
   the second locking facility is designed as a screw which engages through the cover facility into the housing.

7. A method, for the release of a first opening of a housing of a power semiconductor arrangement, comprising the steps of:
   providing said power semiconductor arrangement, having a switching facility, further comprising:
      a housing having a load connection facility for connecting in an electrically conductive manner to an external supply line and having a first plug-in connecting facility for plug-in connecting to an external second plug-in connecting facility;
      the housing has a first opening through which a connecting facility for connecting the load connection facility and the associated external supply line is accessible;
      a cover facility for covering the first opening is arranged on the housing in such a manner as to be mechanically movable from a first end position into a second end position and has a first locking facility which cooperates functionally with the external second plug-in connecting facility; and whereby the first opening is closed with the cover facility as long as it is in its first end position, as long as the external second plug-in connecting facility is inserted into the first plug-in connecting facility; and wherein, starting from the arrangement of the external, second plug-in connecting facility in the first plug-in connecting facility, it is first necessary to cancel this arrangement in order to move the cover facility and thus release the first opening; and the cover facility has a second locking facility which can only be released if the arrangement of the external second plug-in connecting facility in the first plug-in connecting facility is cancelled and only after the subsequent release of the second locking facility can the cover facility be moved and thus the first opening can be released; and the second locking facility cooperates with the housing, whereby the cover facility cannot be moved as long as the second locking facility is connected in a non-positive or positive-locking manner to the housing.

* * * * *